United States Patent
Kawakami et al.

(10) Patent No.: US 7,209,218 B2
(45) Date of Patent: Apr. 24, 2007

(54) EXPOSURE APPARATUS AND METHOD FOR MANUFACTURING DEVICE USING THE EXPOSURE APPARATUS

(75) Inventors: Tomoaki Kawakami, Utsunomiya (JP); Ken-ichiro Shinoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/460,354

(22) Filed: Jul. 27, 2006

(65) Prior Publication Data

US 2007/0024839 A1    Feb. 1, 2007

(30) Foreign Application Priority Data

Jul. 28, 2005    (JP)    .............................. 2005-218727

(51) Int. Cl.
*G03B 27/74*    (2006.01)
*G03B 27/42*    (2006.01)
*G03B 27/54*    (2006.01)

(52) U.S. Cl. .............................. 355/68; 355/53; 355/67

(58) Field of Classification Search .................. 355/53, 355/55, 67–71; 250/548; 430/311; 356/399–401
See application file for complete search history.

(56) References Cited

U.S. PATENT DOCUMENTS

| 6,614,597 B2 | 9/2003 | Mizouchi |
| 6,894,764 B2 * | 5/2005 | Shinoda ........................ 355/67 |
| 6,897,944 B2 * | 5/2005 | Shiozawa ..................... 355/71 |
| 6,903,801 B2 | 6/2005 | Mori |
| 7,095,560 B2 * | 8/2006 | Toyoda et al. .............. 359/558 |
| 2003/0197847 A1 | 10/2003 | Shinoda |

FOREIGN PATENT DOCUMENTS

| JP | 05-217853 A | 8/1993 |
| JP | 11-087232 A | 3/1999 |
| JP | 2003-318086 A | 11/2003 |

\* cited by examiner

Primary Examiner—Henry Hung Nguyen

(57) ABSTRACT

At least one exemplary embodiment is directed to an exposure apparatus which includes an illumination optical system configured to irradiate a mask with light from a light source, and a projecting optical system configured to project a pattern image of the mask onto a substrate. The illumination optical system provides a first light intensity which can be altered by an optical unit forming a second light intensity. The second light intensity can be further altered by an optical unit changing the dimension of the second light intensity forming a third light intensity, where the third light intensity can be used in the lithographic process for forming devices.

9 Claims, 15 Drawing Sheets

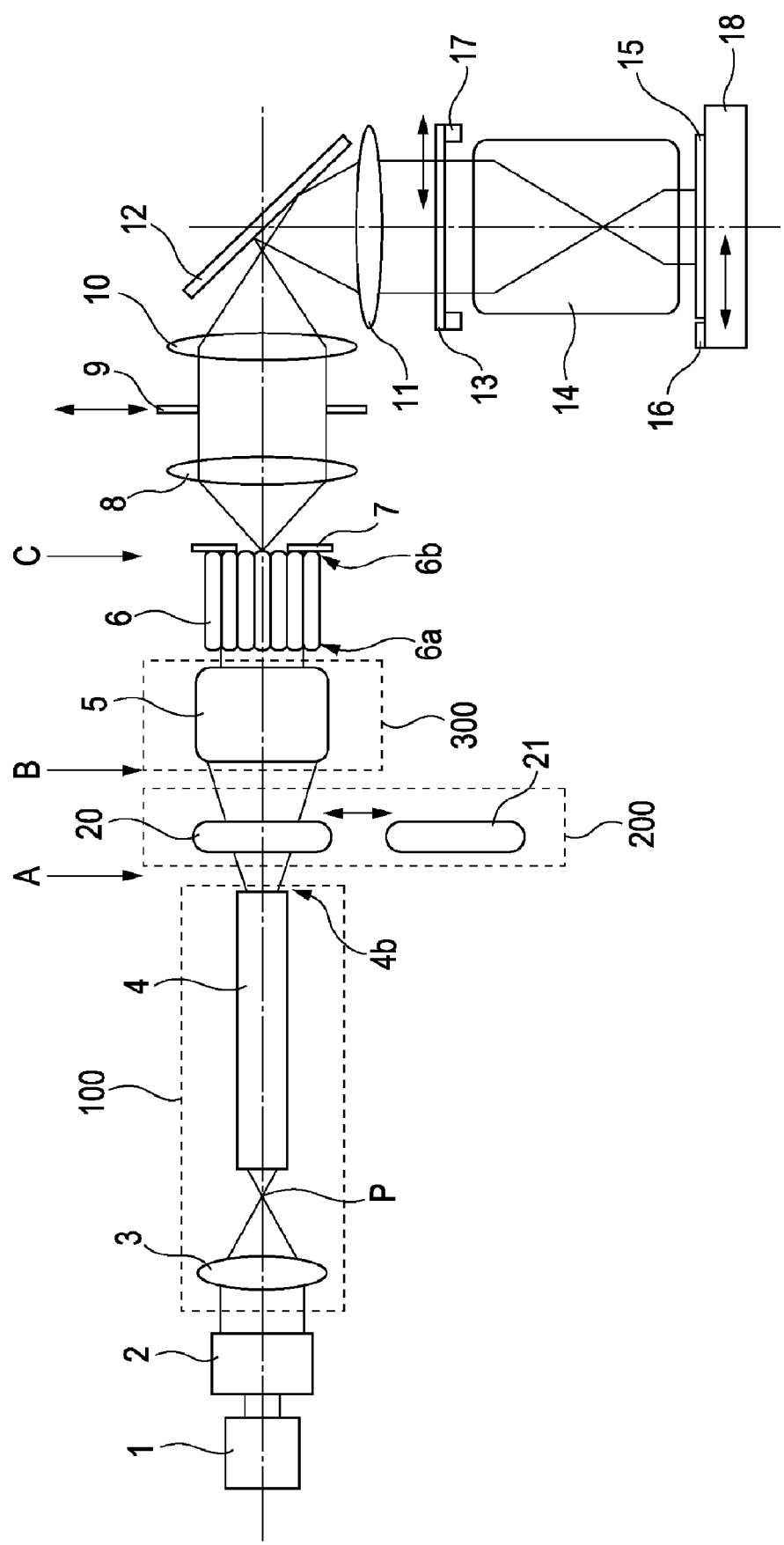

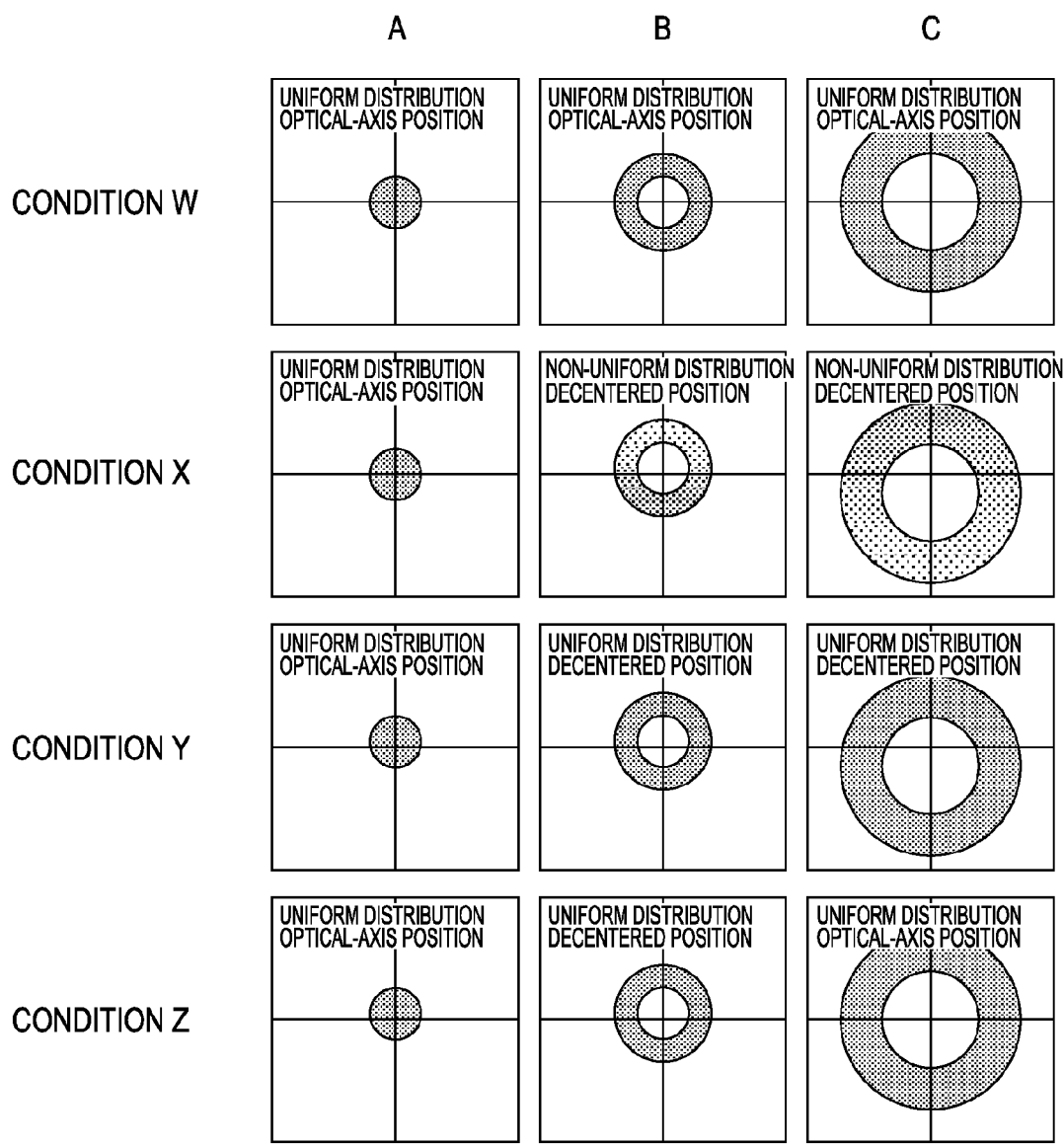

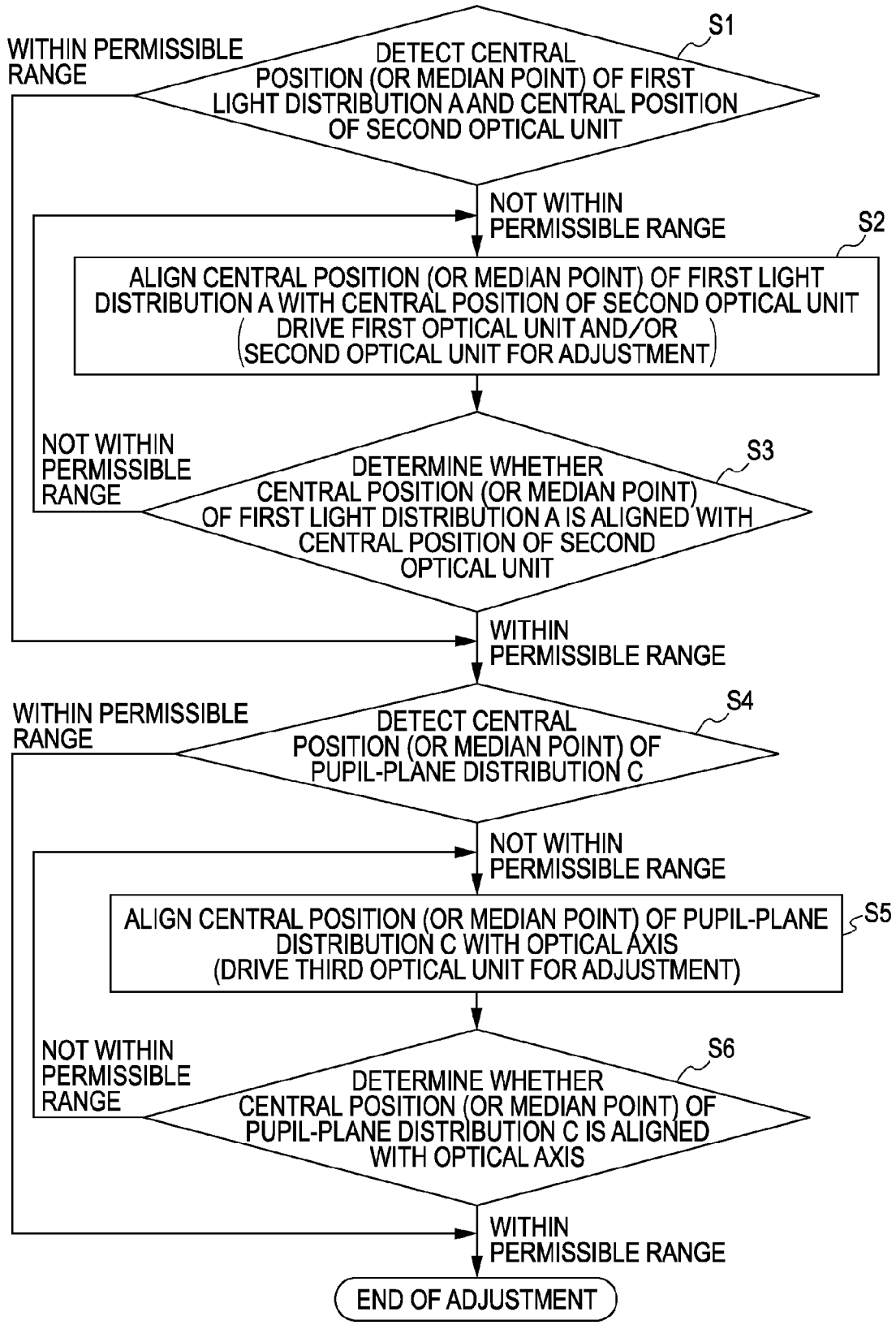

EXPOSURE APPARATUS AND METHOD FOR MANUFACTURING DEVICE USING THE EXPOSURE APPARATUS

BACKGROUND OF THE INVENTION

1. Field of the Invention

The present invention generally relates to an exposure apparatus and a method for manufacturing a device using such an exposure apparatus. In particular, though not exclusively, the present invention relates to an exposure apparatus used when manufacturing a device, such as a semiconductor device and a liquid-crystal device, by lithography, and to a method for manufacturing a device using such an exposure apparatus.

2. Description of the Related Art

In recent years, miniaturization of semiconductor devices is rapidly evolving, and the main processing technique for these semiconductor devices is photolithography. There are a variety of photolithography techniques that can be applied in order to comply with such trend of miniaturization.

One known technique is a modified illumination technique in which an optimal effective light-source distribution is formed in accordance with a pattern of a reticle (photo mask). An effective light-source distribution refers to an angular distribution of an exposure light beam incident on a wafer surface, and is a light intensity distribution of a pupil plane of a projecting optical system. An effective light-source distribution is formed by adjusting a light intensity distribution of a pupil plane (for example, a plane near an exit face of a fly-eye lens) into a desired shape. The pupil plane is substantially equivalent to a Fourier-transformation surface, in an illumination optical system, which is substantially a Fourier transformation relationship with a surface provided with a pattern of a reticle. Known examples of modified illumination are annular illumination, quadrupole illumination, and dipole illumination (for example, see Japanese Patent Laid-Open No. 11-87232 and Japanese Patent Laid-Open No. 2003-318086).

It is of high concern how the degree of accuracy (i.e. the degree of symmetry and deviation of a center of gravity) of the effective light-source distribution to be adjusted in the course of modified illumination can affect the property of a pattern image formed on the wafer.

If an effective light-source distribution is asymmetrical, this can possibly be due to an optical system for forming the effective light-source distribution being decentered from an optical axis. For example, a conical prism or a pyramidal prism can be used for providing an effective light-source distribution in the course of modified illumination. When a light beam having an axially-symmetrical intensity distribution enters the prism, if the center of gravity of the light intensity distribution is misaligned with the apex of the prism, the effective light-source distribution formed by the prism becomes unbalanced, whereby the symmetry (uniformity) of the distribution is lost. Furthermore, in a case where a zoom optical system is used as the optical system, an optical element in the zoom optical system could possibly become decentered from the optical axis when the optical element is driven. In this case, the effective light-source distribution similarly becomes unbalanced, whereby the symmetry of the distribution is lost.

As a countermeasure for restricting the effective light-source distribution from becoming asymmetrical, a technique for adjusting the effective light-source distribution has been discussed in which the prism is driven in a direction perpendicular to the optical axis while measuring the effective light-source distribution (for example, see Japanese Patent Laid-Open No. 5-217853).

However, according to the technique discussed in Japanese Patent Laid-Open No. 5-217853, it can be difficult to adjust the symmetry and the center of gravity of the effective light-source distribution individually.

SUMMARY OF THE INVENTION

At least one exemplary embodiment is directed to an exposure apparatus that can individually and simply adjust the symmetry (uniformity) and a center of gravity of an effective light-source distribution (particularly, an effective light-source distribution in the course of modified illumination).

According to an aspect of the present invention, an exposure apparatus includes an illumination optical system configured to irradiate a mask with light from a light source, and a projecting optical system configured to project a pattern image of the mask onto a substrate. The illumination optical system includes a first optical unit configured to provide a first light intensity distribution, a second optical unit configured to change a shape of the first light intensity distribution so as to provide a second light intensity distribution, and a third optical unit configured to change a dimension of the second light intensity distribution so as to provide a third light intensity distribution. The first optical unit, the second optical unit, and the third optical unit can be arranged in that order from the light source. A symmetry (uniformity) of the third light intensity distribution and a center of gravity of the third light intensity distribution are individually adjustable by decentering at least two of the first optical unit, the second optical unit, and the third optical unit.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate at least one exemplary embodiment of the invention.

FIG. 1 schematically illustrates an exposure apparatus according to a first exemplary embodiment of the present invention.

FIG. 8 illustrates conditions of light intensity distribution at different adjustment stages.

FIG. 9 is a flow chart of an adjustment technique.

DESCRIPTION OF THE EMBODIMENTS

Figure 2A:
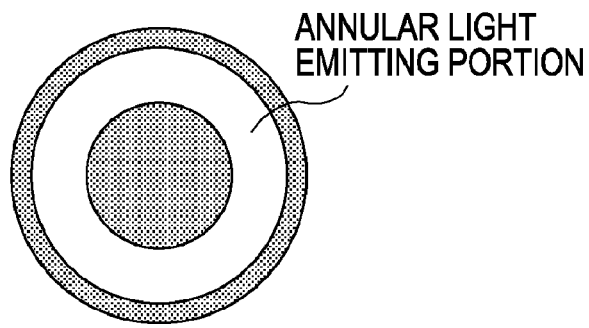
FIGS. 2A and 2B illustrate an effective light-source distribution and device configured for attaining the effective light-source distribution.

Exemplary embodiments of the present invention will now be described with reference to the attached drawings.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the lens elements and their materials.

In all of the examples illustrated and discussed herein any specific values, for example the zoom ratio and F number, should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

Note that herein when referring to correcting or corrections of an error (e.g., an aberration), a reduction of the error and/or a correction of the error is intended.

First Exemplary Embodiment

FIG. 1 schematically illustrates an exposure apparatus according to a first exemplary embodiment of the present invention, which can be used when manufacturing devices, such as semiconductor devices and liquid-crystal devices.

The exposure apparatus includes a light source 1, for example, an excimer laser or an ultrahigh pressure mercury lamp that emits a light beam in an ultraviolet region or a far ultraviolet region or other light source as known by one of ordinary skill in the relevant arts. A light beam emitted from the light source 1 is shaped into a desired cross sectional shape by a beam shaping optical unit 2, and is then focused on a point near an incident face of an optical rod 4 by a condenser optical part 3.

In a case where the optical rod 4 includes glass, a focal point P by the condenser optical part 3 can be defocused closer towards the light source 1 from the incident face of the optical rod 4 so as to increase the durability of the glass rod.

An image on an exit face 4b of the optical rod 4 is formed on an incident face 6a of a fly-eye lens 6 with a predetermined magnification by a focus zoom lens 5. The exit face 4b of the optical rod 4 and the incident face 6a of the fly-eye lens 6 can form a substantially conjugated relationship. The focus zoom lens 5 can have a variable image-formation magnifying power such that a cross-sectional dimension of a light beam incident on the fly-eye lens 6 is adjustable, thereby facilitating a plurality of illumination conditions.

The fly-eye lens 6 includes a plurality of microlenses that can be arranged two dimensionally. An exit face 6b of the fly-eye lens 6 serves as a pupil plane of an illumination optical system, thereby providing a pupil-plane distribution (effective light-source distribution).

The pupil plane of the illumination optical system includes an aperture stop 7 configured to block unnecessary light so as to achieve a desired distribution. The dimension and shape of an aperture of the aperture stop 7 can be adjusted by a driving mechanism, not shown.

A condenser lens 8 is configured to superimpose light beams emitted from a plurality of secondary light sources, which are formed near the exit face 6b of the fly-eye lens 6, onto a field stop 9.

The field stop 9 includes a plurality of movable light-blocking plates by which an aperture thereof can be formed into a desired shape. Thus, the field stop 9 regulates an illumination range (exposure range) on a surface of a reticle 13 subject to illumination. Imaging lenses 10, 11 are provided for transferring the aperture shape of the field stop 9 onto the reticle 13 subject to illumination via a deflecting mirror 12.

The reticle 13 is supported by a reticle stage 17 and is controlled by a driving mechanism, not shown. A projecting optical system 14 de-magnifies the pattern of the reticle 13 and projects the de-magnified pattern onto a surface of a wafer 15.

The wafer 15 can function as a substrate onto which the pattern on the surface of the reticle 13 can be projected. The wafer 15 is disposed in an image-formation plane of the projecting optical system 14. The wafer 15 is supported by a wafer stage 18 which is movable in an optical-axis direction of the projecting optical system 14 and also movable two-dimensionally in a direction perpendicular to the optical axis. The movement of the wafer stage 18 is controlled by a driving mechanism, not shown.

When an exposure process is performed on the wafer 15, the reticle stage 17 and the wafer stage 18 are scanned in synchronization with each other in directions indicated by arrows in the drawing. A coordinate system in the first exemplary embodiment is set such that a Y-axis direction represents the scanning direction, a Z-axis direction represents the optical-axis direction of the projecting optical system 14, and an X-axis direction represents a direction perpendicular to the Y-axis direction and Z-axis direction.

A detector (illuminometer) 16 is provided for detecting the quantity of exposure light incident on the surface of the wafer 15. The detector 16 has a light receiving section that is aligned with the surface of the wafer 15, and is moved in accordance with a driving operation of the wafer stage 18 so as to receive the exposure light within an exposure region. Moreover, the detector 16 sends a signal corresponding to an output thereof to a main controller, not shown. The main controller controls each of the driving mechanisms, and also can store information related with the pupil-plane distribution (effective light-source distribution) and the total quantity of light transmitted through the pattern of the reticle 13.

Illumination-light formation parts 20 and 21 each include a refractive optical element, such as a prism, for converting the cross-sectional shape of the light released from the optical rod 4 to an annular shape or a quadrupole shape in accordance with the illumination conditions (for example, annular illumination, quadrupole illumination, and dipole illumination).

An optical system which irradiates the reticle 13 with light from the light source 1 and which extends between the light source 1 and the reticle 13 will be referred to as an illumination optical system.

Furthermore, the condenser optical part 3 and the optical rod 4 (optical integrator) will be defined as a first optical unit 100; the illumination-light formation part 20 (21) will be defined as a second optical unit 200; and the focus zoom lens 5 will be defined as a third optical unit 300. Moreover, a light intensity distribution provided by the first optical unit 100 will be referred to as a first light intensity distribution A, and a light intensity distribution provided by the second optical unit 200 will be referred to as a second light intensity distribution B.

The first to third optical units 100 to 300 convert a light beam emitted from the light source 1 into a desired shape and control the intensity distribution and angular distribution of a light beam entering the fly-eye lens 6 serving as an optical integrator so as to adjust a third light intensity distribution C (pupil-plane distribution), which is a light intensity distribution of the pupil plane of the illumination optical system.

In a step-and-scan exposure technique, an exposure process is performed by scanning the reticle 13 and the wafer 15 in synchronization with each other in the directions of the corresponding arrows shown in FIG. 1. If the scanning rate of the wafer stage 18 is V (mm/sec) and a de-magnifying power of the projecting optical system 14 is 1/β, the scanning rate of the reticle stage 17 is set to βV (mm/sec). Furthermore, the field stop 9 is also driven in a direction of an arrow shown in FIG. 1 in synchronization with the scanning operation of the reticle stage 17 and the wafer stage 18.

Figure 2B:
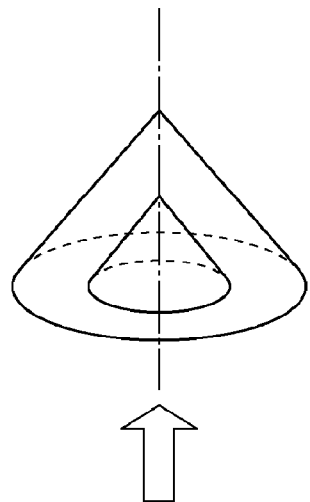

The second optical unit 200 will now be described in detail. In a case where a commonly known annular effective light-source distribution is to be formed as illustrated in FIG. 2A, the illumination-light formation part 20 (or 21) can be defined, for example, by an optical prism, which can have a concave conical surface on its incident side and a convex conical surface on its exit side, as illustrated in FIG. 2B. Alternatively, the incident side can be a flat surface.

Figure 3A:
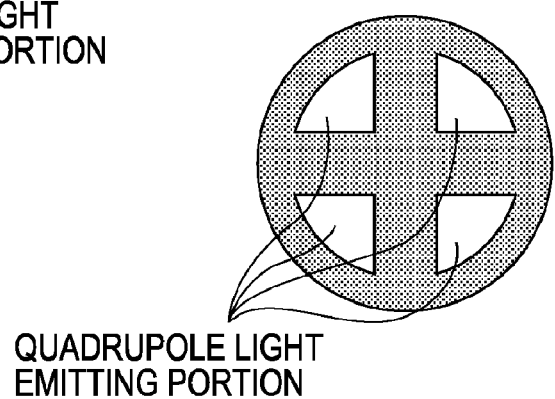
FIGS. 3A and 3B illustrate an effective light-source distribution and device configured for attaining the effective light-source distribution.
Figure 3B:
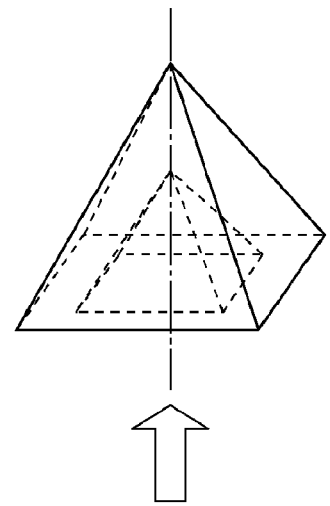

On the other hand, in a case where a quadrupole effective light-source distribution is to be formed as illustrated in FIG. 3A, the illumination-light formation part 20 (or 21) can be defined by a prism, which can have a concave quadrangular-pyramid surface on its incident side and a convex quadrangular-pyramid surface on its exit side, as illustrated in FIG. 3B. Alternatively, the incident side can be a flat surface. An angle formed between each ridge line of the quadrangular pyramid on the incident side and the optical axis and an angle formed between each ridge line of the quadrangular pyramid on the exit side and the optical axis can be equal to each other, or alternatively, can be set different from each other to improve the illumination efficiency. This applies similarly to the conical prism described above.

Figure 4A:
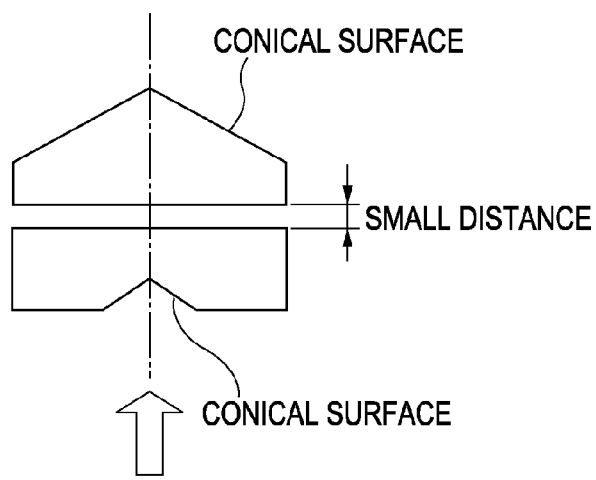
FIGS. 4A and 4B illustrate a device configured for forming an annular effective light-source distribution, which can have a high annular ratio.
Figure 5A:
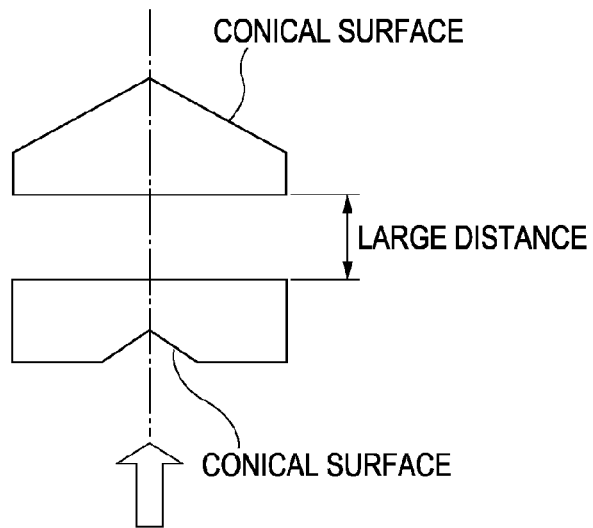
FIGS. 5A and 5B illustrate a device configured for forming an annular effective light-source distribution, which can have a low annular ratio.

Referring to FIGS. 4A and 5A, the illumination-light formation part 20 (or 21) can be defined by a pair of prisms, such that the prisms are equivalently movable in the optical-axis direction so as to allow for various shapes of effective light-source distributions.

Figure 4B:
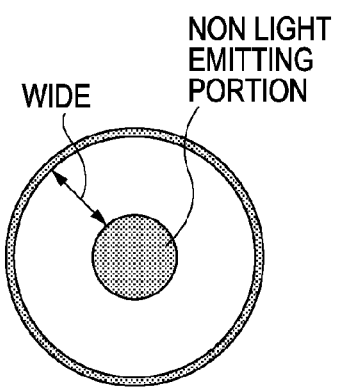

Referring to FIG. 4A, the pair of prisms can include a first prism, which can have a concave conical surface on its incident side and a flat surface on its exit side, and a second prism, which can have a flat surface on its incident side and a convex conical surface on its exit side. If the distance between the first and second prisms is small as illustrated in FIG. 4A, an annular effective light-source distribution with a wide light emitting portion and a high annular ratio is formed, as illustrated in FIG. 4B.

Figure 5B:
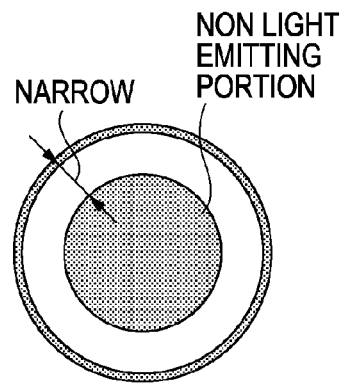

On the other hand, if the distance between the first and second prisms is increased as illustrated in FIG. 5A, an annular effective light-source distribution with a narrow light emitting portion and a low annular ratio is formed, as illustrated in FIG. 5B.

Furthermore, by combining the pair of prisms with the focus zoom lens 5 disposed at a position of subsequent stage relative to the prisms and functioning as an optical zoom element, the dimension (σ value) of the effective light-source distribution can be made adjustable while maintaining the current shape (annular ratio).

For example, in a case where the annular effective light-source distribution shown in FIG. 2A is to be formed, the first light intensity distribution A is given a circular shape in the first optical unit 100, and the second light intensity distribution B is given an annular shape in the second optical unit 200. Moreover, by driving the optical element of the second optical unit 200, the ratio (annular ratio) between the outer diameter and the inner diameter of the annular shape can be adjusted.

Furthermore, by combining the first and second optical units 100 and 200 with the third optical unit 300 disposed at a position of subsequent stage relative thereto, the dimension (σ value) of the effective light-source distribution can be made adjustable while maintaining the shape of the second light intensity distribution B.

A technique for measuring an effective light-source distribution (i.e. an angular distribution of exposure light) will now be described.

There are several techniques for measuring an effective light-source distribution. For example, in one technique, the field stop 9 is driven so as to set a micro-aperture at a position corresponding to a point on the wafer 15 subject to measurement, and the detector 16 is defocused in the Z-axis direction (i.e. the optical-axis direction) from a reference plane of the wafer 15 (i.e. the image plane of the projecting optical system 14). In this case, the reticle 13 is removed from the optical path.

Figure 6B:
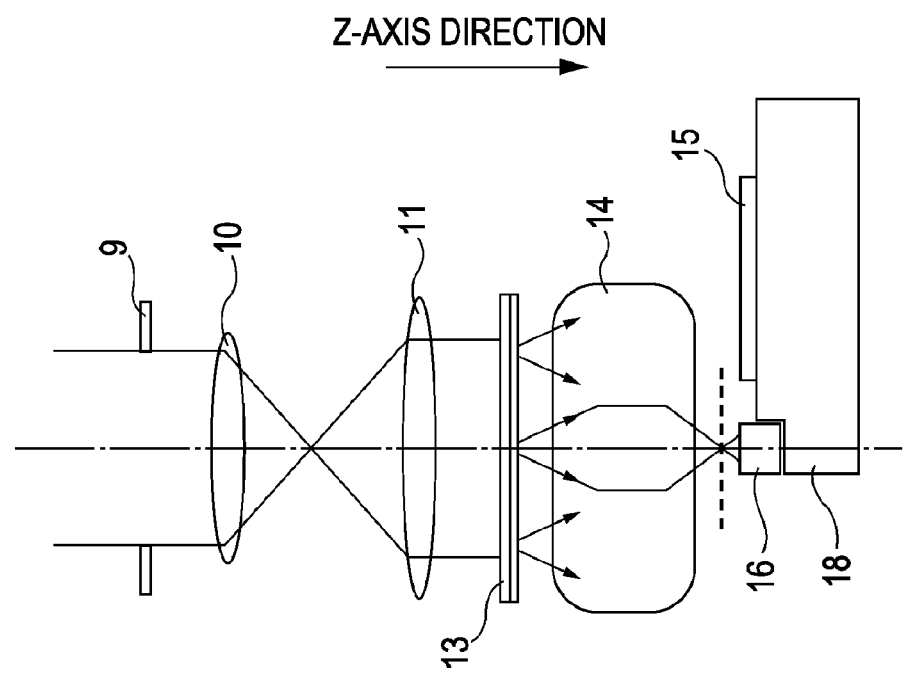
FIGS. 6A and 6B illustrate a technique for measuring an angular distribution of exposure light.
Figure 6A:
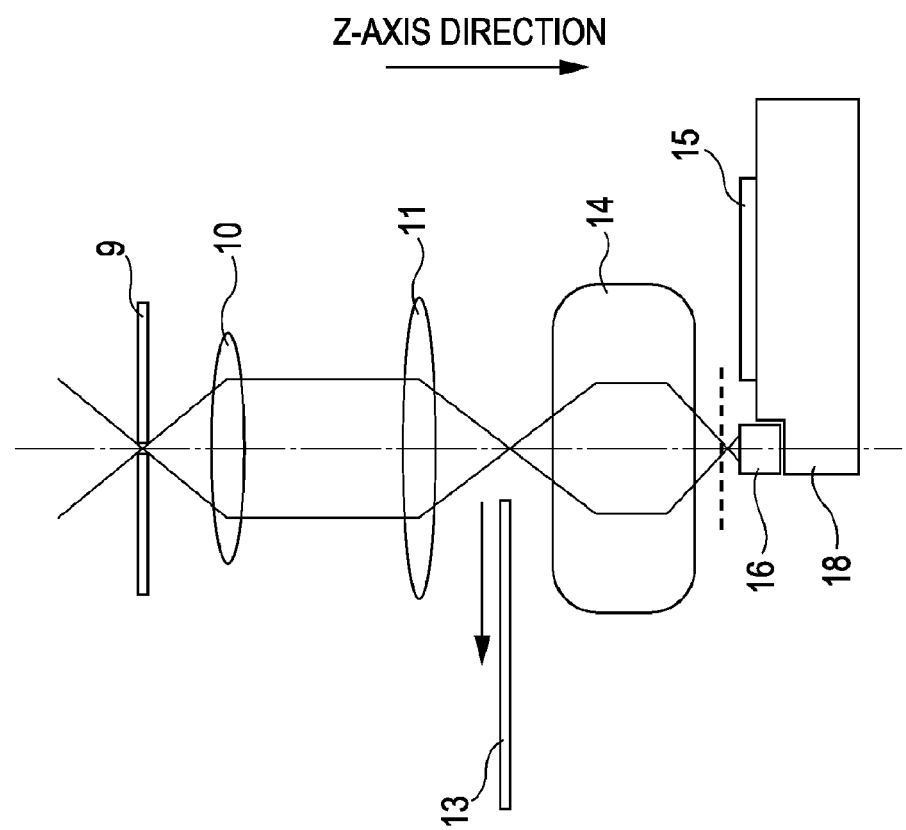
Figure 7E:
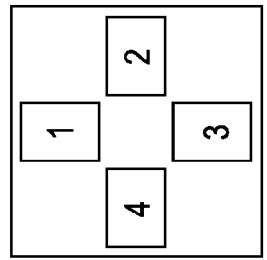
FIGS. 7A to 7E' illustrate various determination types having determination regions that are used when adjusting a light intensity distribution.
Figure 7D:
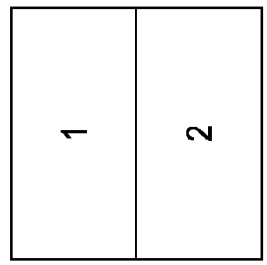
Figure 7C:
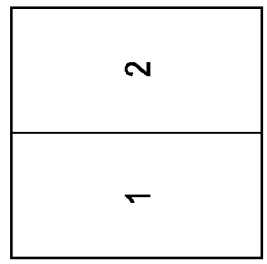
Figure 7B:
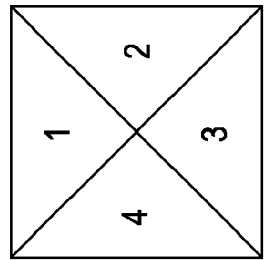
Figure 7A:
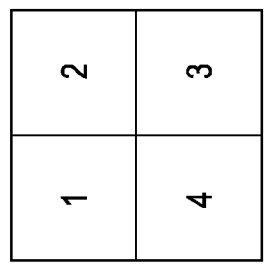
Figure 7E:
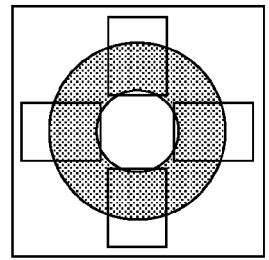
Figure 7D:
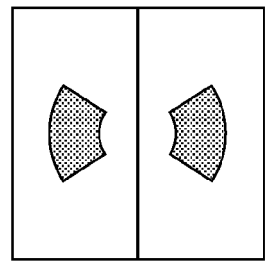
Figure 7C:
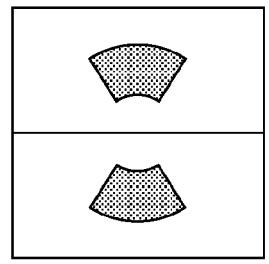
Figure 7B:
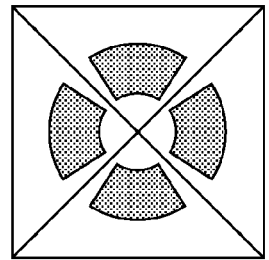
Figure 7A:
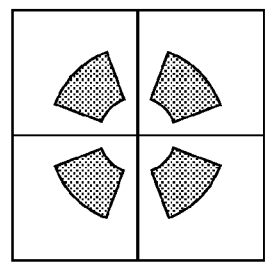

FIG. 6A illustrates the state of the apparatus in the course of performing this technique. Components shown in FIG. 6A that are the same as those in FIG. 1 are given the same reference numerals. To simplify the illustration, the deflecting mirror 12 is not shown in FIG. 6A.

An image is formed temporarily on the wafer surface only with the exposure light that has passed through the field stop 9. While the angle of the light is maintained, the light then enters the detector 16. The detector 16 is disposed on the wafer stage 18 (XY stage) that supports the wafer 15. The light receiving section of the detector 16 includes a pinhole, which can have a diameter small enough against spreading of a light beam. The detector 16 is moved horizontally within, for example, a two-dimensional matrix range on the wafer stage 18 so as to measure the intensity of incident light, thereby determining an angular distribution of the exposure light. Alternatively, the detector 16 can be replaced with a two-dimensional CCD, CMOS, or other image pickup devices as known by one of ordinary skill and equivalents.

A similar measurement can be achieved by providing micro-apertures at conjugated positions with respect to the field stop 9. In detail, referring to FIG. 6B, the field stop 9 can be opened, and a reticle designated for measurement and provided with micro-apertures, for example, a Cr pattern can be used, or a designated plate disposed on the reticle stage 17 can be used.

Accordingly, an effective light-source distribution at each image height can be measured by performing a measurement for a desired point corresponding to an exposure region on the wafer 15. Moreover, a distribution of the total quantity of light incident on the points (i.e. an illumination distribution on the wafer surface) can also be determined.

Referring to FIGS. 7A to 7E', in order to determine the degree of symmetry (uniformity) of the distribution by measurement, a plurality of determination types can be used in accordance with the various shapes of effective light-source distributions. If an effective light-source distribution has a dipole shape, a determination type having two-sectioned determination regions shown in FIG. 7C or 7D can be used. In this case, by measuring the light intensity in each of the two-sectioned determination regions, a center of gravity or the degree of symmetry of the light intensity can be determined. If an effective light-source distribution has a cross-pole shape having four poles in the X-axis and Y-axis directions, a determination type having determination regions shown in FIG. 7B can be used. If an effective light-source distribution has a quadrupole shape having four poles in ±45° directions, a determination type having determination regions shown in FIG. 7A can be used. If an effective light-source distribution has an annular shape, one of the determination types having four-sectioned determination regions shown in FIGS. 7A, 7B, and 7E can be used.

The relationship among the first optical unit 100, the second optical unit 200, the third optical unit 300, the fly-eye lens 6, the first light intensity distribution A, the second light intensity distribution B, and the pupil-plane distribution C will be described below in detail with reference to FIG. 1.

The first optical unit 100 includes the optical rod 4. The illumination-light formation part 20 included in the second optical unit 200 can be, for example, a conical prism. A zooming power of the third optical unit 300 can be fixed. The third optical unit 300 is configured to form one image, which is inverted.

With this configuration, the condition of the first light intensity distribution A, the second light intensity distribution B, and the pupil-plane distribution C is shown as condition W in FIG. 8. In other words, if there is no eccentricity, the distributions A, B, and C all have high symmetric properties, and the center of gravities of the distributions A, B, and C are all aligned with the optical axis.

However, in view of component tolerances, assembly tolerances, and driving tolerances, it can be assumed that the optical units can actually be slightly decentered from the optical axis.

Therefore, even if the symmetry of the first light intensity distribution A or the second light intensity distribution B were lost and the center of gravities thereof were deviated from the optical axis, the symmetry and the center of gravity of the pupil-plane distribution C required for the final performance can be maintained in a good condition. An adjustment technique for maintaining a good condition of the pupil-plane distribution C will now be described.

FIG. 9 is a flow chart of such an adjustment technique.

The adjustment technique includes step S1 to step S6, which will be described below in detail.

In step S1, the central position (or the center of gravity) of the first light intensity distribution A and the central position of the second optical unit 200 are detected. If a difference between the two positions is within a permissible range, the operation proceeds to step S4. If the difference is not within the permissible range, the operation proceeds to step S2.

Step S2 is a step for aligning the central position (or the center of gravity) of the first light intensity distribution A with the central position of the second optical unit 200. In order to achieve this, the first optical unit 100 can be driven for adjustment, or the second optical unit 200 can be driven for adjustment or both.

In step S3, it is determined whether the central position (or the center of gravity) of the first light intensity distribution A and the central position of the second optical unit 200 are aligned with each other. If a difference between the two positions is within the permissible range, the operation proceeds to step S4. If the difference is not within the permissible range, the operation returns to step S2.

In step S4, an amount of displacement of the central position (or the center of gravity) of the pupil-plane distribution C with respect to the optical axis is detected. If the amount of displacement is within a permissible range, the adjustment operation is completed. If the amount of displacement is not within the permissible range, the operation proceeds to step S5.

Step S5 is a step for aligning the central position (or the center of gravity) of the pupil-plane distribution C with the optical axis. In order to achieve this, the third optical unit 300 is driven for adjustment.

In step S6, it is determined whether the central position (or the center of gravity) of the pupil-plane distribution C is aligned with the optical axis. If an amount of displacement of the central position (or the center of gravity) of the pupil-plane distribution C with respect to the optical axis is within the permissible range, the adjustment operation is completed. If the amount of displacement is not within the permissible range, the operation returns to step S5.

The adjustment technique will be described below in detail with reference to FIGS. 8 and 10.

Figure 10:
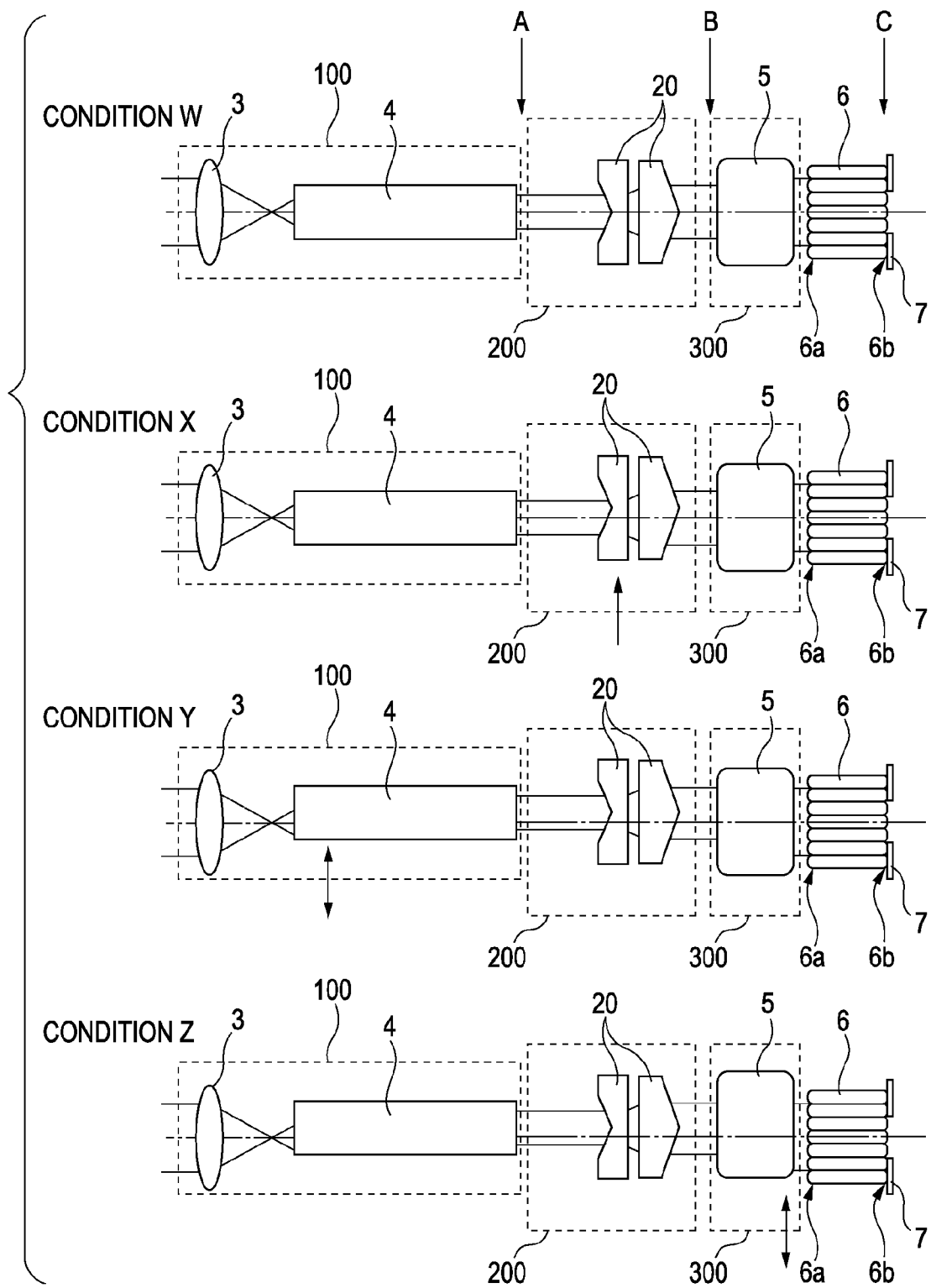
FIG. 10 illustrates optical positional conditions at different adjustment stages.

Condition X in FIG. 10 is a state where the first light intensity distribution A has good symmetry and has its center of gravity aligned with the optical axis of the illumination optical system, but the illumination-light formation part 20 is decentered from the optical axis.

Thus, the symmetry of the second light intensity distribution B and the pupil-plane distribution C is lost and the center of gravities thereof are deviated from the optical axis, as illustrated in condition X in FIG. 8.

First, as illustrated in condition Y in FIG. 10, an optical element in the first optical unit 100 (i.e. the optical rod 4 in the first exemplary embodiment) is driven eccentrically in a direction substantially perpendicular to the optical axis of the illumination optical system so that the center of gravity of the first light intensity distribution A is aligned with the apex of the decentered illumination-light formation part 20.

This alignment can be achieved by applying the measurement technique for an effective light-source distribution shown in FIG. 6A or 6B. Specifically, the light intensity of the sectioned determination regions shown in one of FIGS. 7A to 7E' is measured, and the optical element of the first optical unit 100 is driven for adjustment so that the quantity of light is the same among the regions.

As another technique, a change in the center of gravity of an effective light-source distribution in response to insertion and ejection of the illumination-light formation part 20 can be observed so as to determine whether the first light intensity distribution A and the apex of the illumination-light formation part 20 are aligned with each other. This technique is based on a predisposition that if the center of gravity of the first light intensity distribution A is not aligned with the apex of the prism (20, 21), the symmetry of the second light intensity distribution B is lost, causing the center of gravity of the second light intensity distribution B when the illumination-light formation part is not present to be not consistent with the center of gravity of the second light intensity distribution B when the illumination-light formation part is present. Consequently, if there is no change in the center of gravity between the state where the illumination-light formation part is present and the state where the illumination-light formation part is not present, it can be determined that the center of gravity of the first light intensity distribution A and the apex of the illumination-light formation part 20 are aligned with each other.

With the configuration of condition Y shown in FIG. 10, the light intensity distributions become condition Y shown in FIG. 8. In other words, even though the center of gravity of the second light intensity distribution B remains deviated from the optical axis, the degree of symmetry thereof can be improved. Moreover, the pupil-plane distribution C has good symmetry, but the center of gravity thereof is deviated.

Subsequently, the optical element in the third optical unit 300 is driven (for example, in a parallel-decentering fashion or tilt-decentering fashion) so as to align the center of gravity of the second light intensity distribution B with the central position of the fly-eye lens 6 (i.e. the central position of the pupil plane), thereby achieving condition Z shown in FIG. 8.

This alignment can be achieved by applying the measurement technique for an effective light-source distribution shown in FIG. 6A or 6B. Specifically, based on this technique, the center of gravity of an effective light-source distribution with the illumination-light formation part 20 being present is measured. The optical element in the third optical unit 300 is driven so that the center of gravity is substantially aligned (within a permissible range) with the optical axis (condition Z in FIG. 10). Thus, the pupil-plane distribution C provides symmetrical intensity distribution, and achieves an effective light-source distribution in which the center of gravity thereof is positioned at the center of the optical axis.

In other words, the pupil-plane distribution C becomes substantially the same as that in the ideal condition W.

Second Exemplary Embodiment

Figure 11:
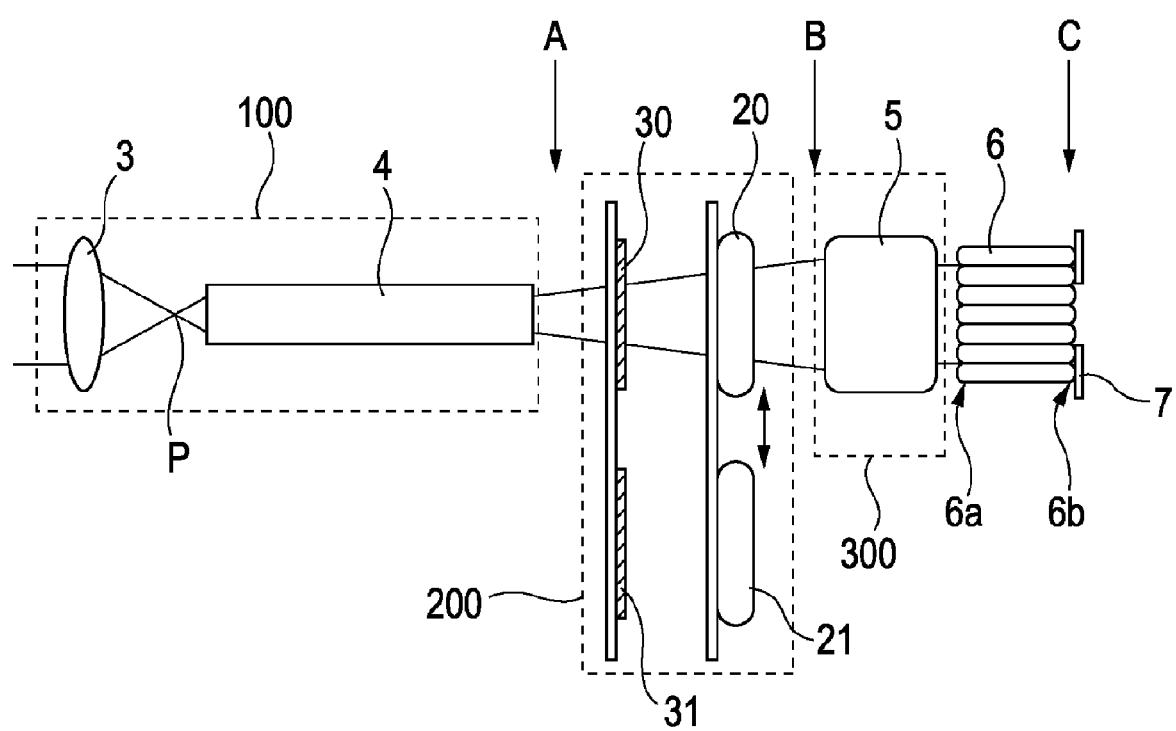
FIG. 11 schematically illustrates an exposure apparatus according to a second exemplary embodiment of the present invention.

A second exemplary embodiment according to at least one exemplary embodiment is illustrated in FIG. 11. Components in FIG. 11 that are given the same reference numerals as those in FIG. 1 have the same function. The second exemplary embodiment is different from the first exemplary embodiment shown in FIG. 1 in that the second exemplary embodiment includes replaceable aperture stops (30, 31) at a position of prior stage relative to the illumination-light formation parts (20, 21). The aperture stops 30, 31 have apertures that are given an annular shape, a quadrupole shape, or a shape that determines an aperture angle, and are thus capable of forming various kinds of effective light-source distributions.

Figure 12:
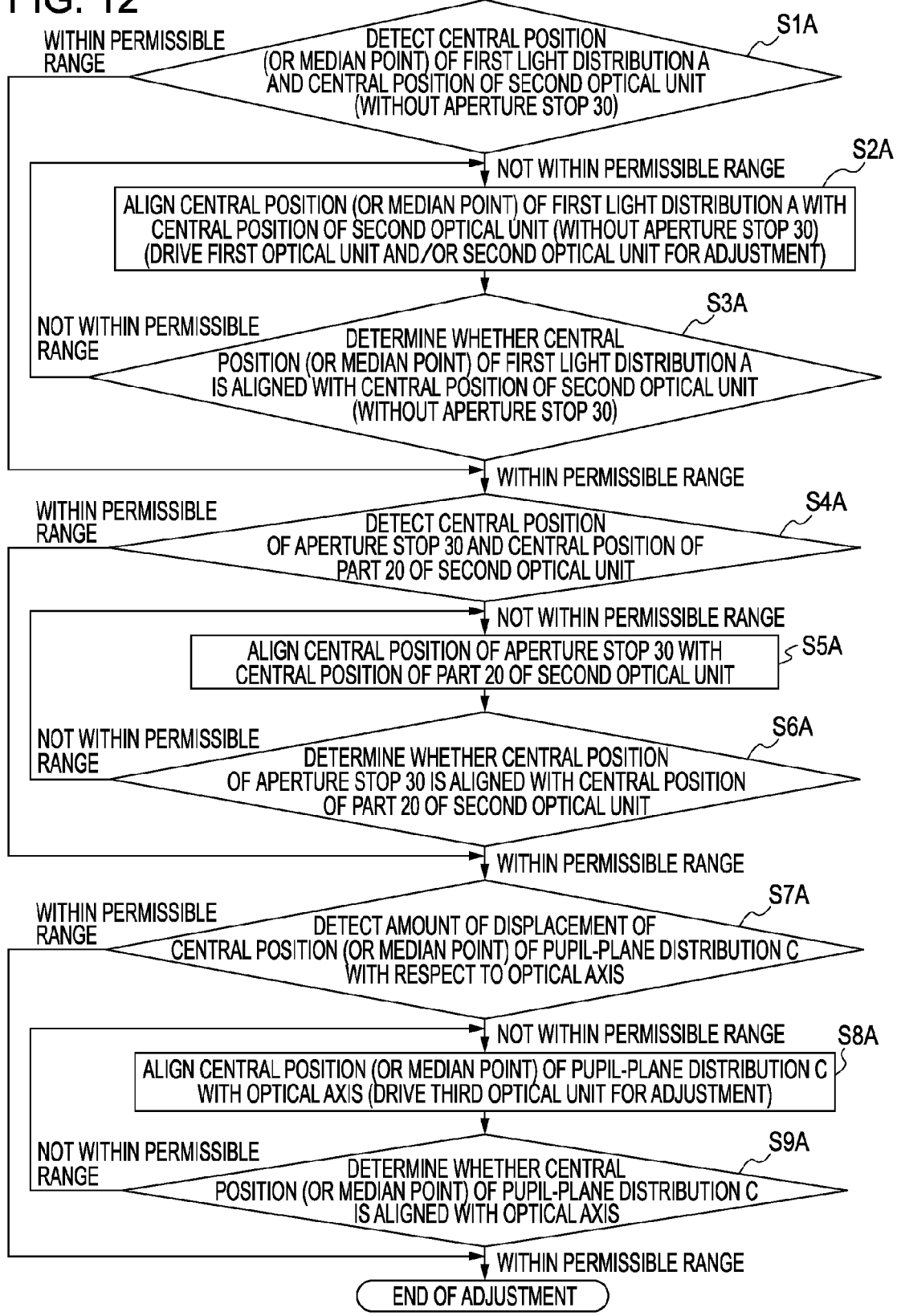
FIG. 12 is a flow chart of an adjustment technique.

FIG. 12 is a flow chart of an adjustment technique in the exposure apparatus according to the second exemplary embodiment shown in FIG. 11.

The adjustment technique includes step S1A to step S9A, which will be described below in detail.

In step S1A, the central position (or the center of gravity) of the first light intensity distribution A and the central position of the illumination-light formation part 20 or 21 of the second optical unit 200 are detected in a state where the aperture stops 30, 31 are not present. If a difference between the two positions is within a permissible range, the operation proceeds to step S4A. If the difference is not within the permissible range, the operation proceeds to step S2A.

Step S2A is a step for aligning the central position (or the center of gravity) of the first light intensity distribution A with the central position of the illumination-light formation part 20 or 21 of the second optical unit 200. In order to achieve this, the first optical unit 100 can be driven for adjustment, and/or the illumination-light formation part 20 or 21 of the second optical unit 200 can be driven for adjustment.

In step S3A, it is determined whether the central position (or the center of gravity) of the first light intensity distribution A and the central position of the illumination-light formation part 20 or 21 of the second optical unit 200 are aligned with each other. If a difference between the two positions is within the permissible range, the operation proceeds to step S4A. If the difference is not within the permissible range, the operation returns to step S2A.

In step S4A, the aperture stop 30 or 31 is set at the optical-axis position, and the central position of the aperture stop 30 or 31 and the central position of the illumination-light formation part 20 or 21 of the second optical unit 200 (previously aligned with the first light intensity distribution A in step S3A) are detected. If a difference between the two central positions is within a permissible range, the operation proceeds to step S7A. If the difference is not within the permissible range, the operation proceeds to step S5A.

Step S5A is a step for aligning the central position of the aperture stop 30 or 31 with the central position of the illumination-light formation part 20 or 21 of the second optical unit 200 (previously aligned with the first light intensity distribution A in step S3A). In order to achieve this, the aperture stop 30 or 31 can be driven for adjustment.

In step S6A, it is determined whether the central position of the aperture stop 30 or 31 and the central position of the illumination-light formation part 20 or 21 of the second optical unit 200 (previously aligned with the first light intensity distribution A in step S3A) are aligned with each other. If a difference between the two positions is within the permissible range, the operation proceeds to step S7A. If the difference is not within the permissible range, the operation returns to step S5A.

In step S7A, an amount of displacement of the central position (or the center of gravity) of the pupil-plane distribution C with respect to the optical axis is detected. If the amount of displacement is within a permissible range, the adjustment operation is completed. If the amount of displacement is not within the permissible range, the operation proceeds to step S8A.

Step S8A is a step for aligning the central position (or the center of gravity) of the pupil-plane distribution C with the optical axis. In order to achieve this, the third optical unit 300 is driven for adjustment.

In step S9A, it is determined whether the central position (or the center of gravity) of the pupil-plane distribution C is aligned with the optical axis. If an amount of displacement of the central position (or the center of gravity) of the pupil-plane distribution C with respect to the optical axis is within the permissible range, the adjustment operation is completed. If the amount of displacement is not within the permissible range, the operation returns to step S8A.

Figure 13:
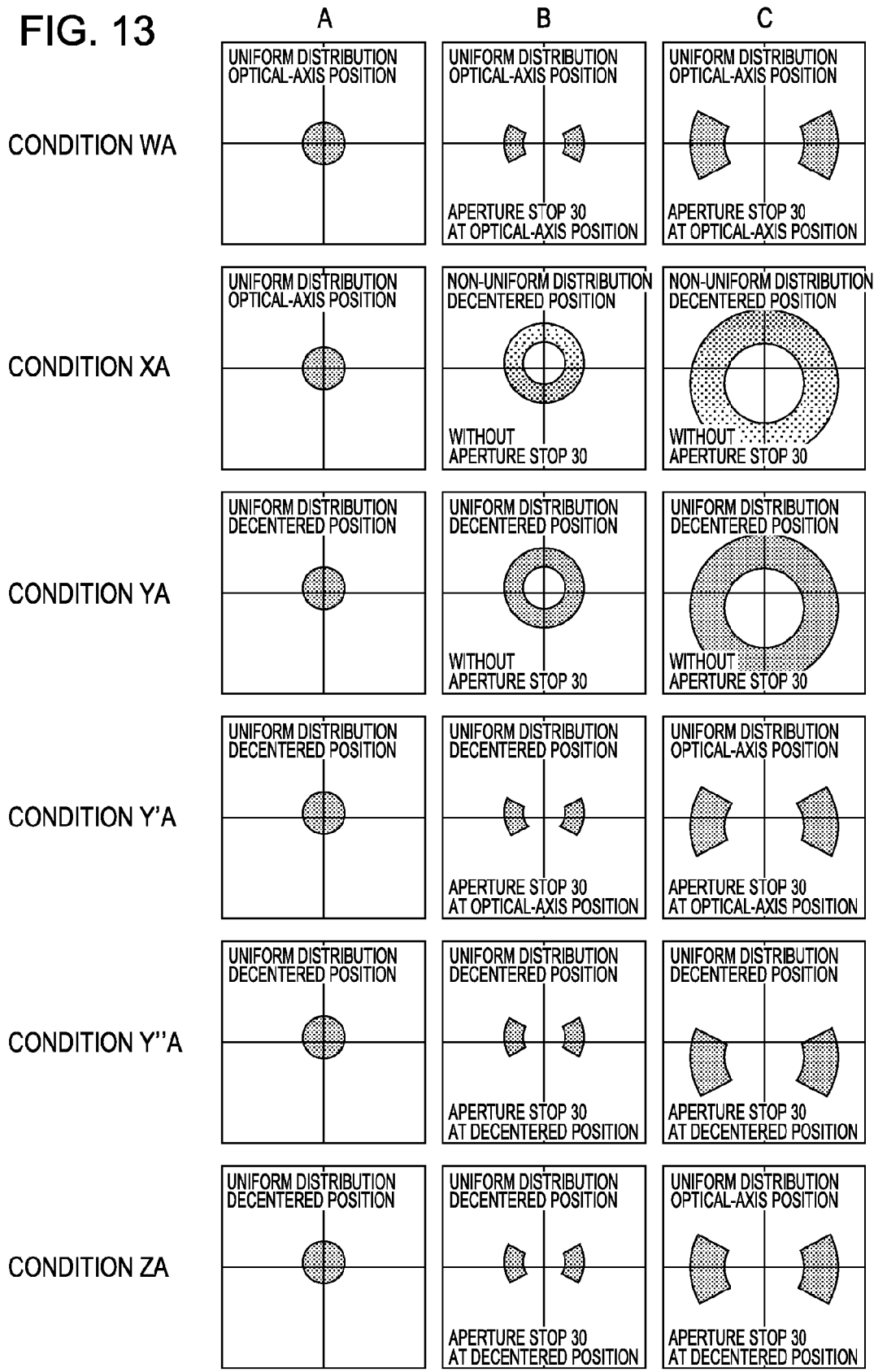
FIG. 13 illustrates conditions of light intensity distribution at different adjustment stages.

FIG. 13 illustrates the conditions of the light intensity distributions A, B, and C at the adjustment stages in FIG. 12. Here, the aperture stop 30 is a dipole aperture stop that determines an angle in the X-axis direction.

Referring to condition XA in FIG. 13, the first light intensity distribution A has good symmetry and has its center of gravity aligned with the optical axis, but the illumination-light formation part 20 is decentered from the optical axis. Thus, the symmetry of the second light intensity distribution B and the pupil-plane distribution C when the aperture stop 30 is not present is lost, and the center of gravities thereof are deviated from the optical axis.

Condition YA in FIG. 13 corresponds to a state where the aperture stop 30 is removed, and the optical element in the first optical unit 100 is driven eccentrically so that the center of gravity of the first light intensity distribution A is aligned with the apex of the decentered illumination-light formation part (20, 21). Although the symmetry of the second light intensity distribution B and the pupil-plane distribution C is corrected or error reduced, the center of gravities thereof are deviated from the optical axis.

Condition Y'A in FIG. 13 corresponds to a state where the aperture stop 30 is set on the optical axis. The first light intensity distribution A and the apex of the illumination-light formation part 20 are aligned with each other at a position distant from the optical axis, but the center of the aperture stop 30 is in the vicinity of the optical axis. Thus, the symmetry of the second light intensity distribution B and pupil-plane distribution C in the Y-axis direction is lost.

Condition Y"A in FIG. 13 corresponds to a state where the aperture stop 30 is driven eccentrically in a direction perpendicular to the optical axis of the illumination optical system so as to align the center of the aperture stop 30 with the apex of the illumination-light formation part 20. Here, the apex of the illumination-light formation part 20 is aligned with the center of gravity of the first light intensity distribution A. In this case, as an adjustment technique, for example, the aperture stop 30 can be driven such that the center of gravity of an effective light-source distribution does not change when the aperture stop 30 is inserted and ejected, as when the illumination-light formation part 20 is inserted and ejected.

Condition ZA in FIG. 13 corresponds to a state where the third optical unit 300 is driven such that the center of gravity of the pupil-plane distribution C is aligned with the optical axis.

According to conditions XA to ZA, even when the aperture stop 30 is present, the symmetry and the center of gravity of the pupil-plane distribution C can be properly adjusted.

Furthermore, if the assembly process of the apparatus can be strictly controlled so that the center of gravities of the aperture stop (30, 31) and the illumination-light formation part (20, 21) can be properly aligned with each other, the aperture stop and the illumination-light formation part can be viewed as a single optical element. In this case, a positioning process with respect to the optical axis can be implemented simply by driving the optical element of the first optical unit 100.

Furthermore, by facilitating the optical element in the first optical unit 100 to be switchable, various kinds of first light intensity distribution A can be formed.

Third Exemplary Embodiment

Figure 14:
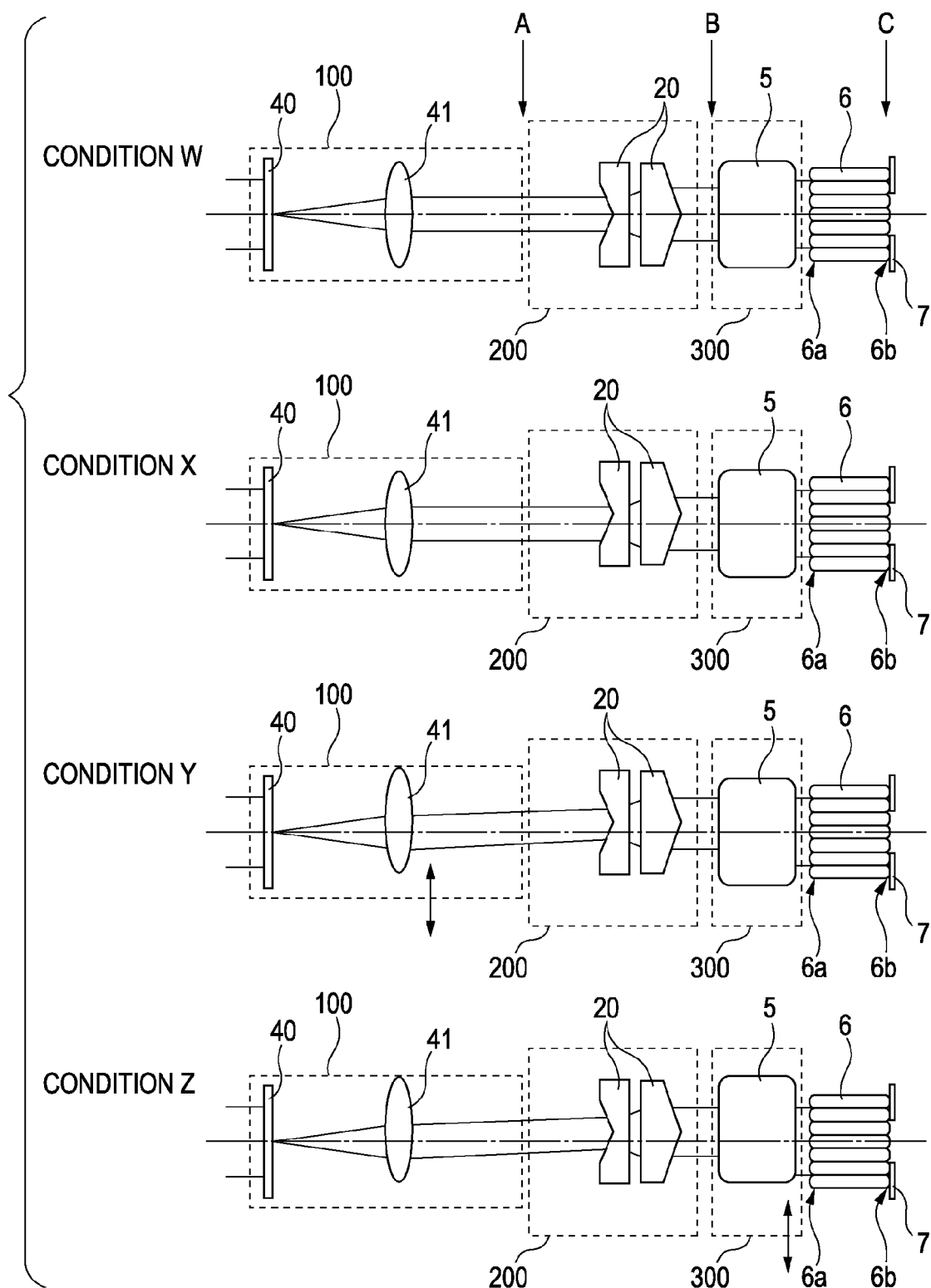
FIG. 14 schematically illustrates an exposure apparatus according to a third exemplary embodiment of the present invention.

A third exemplary embodiment according to at least one exemplary embodiment is illustrated in FIG. 14. Components in FIG. 14 that are given the same reference numerals as those in FIG. 1 have the same function. The third exemplary embodiment is different from the first exemplary embodiment shown in FIG. 1 in that the third exemplary embodiment includes a replaceable diffractive optical element 40 at a position, which can have a Fourier transformation relationship with the incident face 6a of the fly-eye lens 6. The diffractive optical element 40 can be used in order to allow the optical element in the first optical unit 100 to be switchable.

The diffractive optical element 40 is designed such that when a collimated light beam enters the diffractive optical element 40, a predetermined light intensity distribution is formed on a surface that has a Fourier transformation relationship with the diffractive optical element 40. For example, if the effective light-source distribution shown in FIG. 4B can be formed, the diffractive optical element 40 can be designed and manufactured in correspondence with that effective light-source distribution.

If light incident on the diffractive optical element 40 is an angled beam instead of being a collimated beam, the image formed on the Fourier-transformation surface is blurred. Consequently, by giving the condenser optical part 3 a structure such that an angular distribution of light incident on the diffractive optical element 40 is changeable, the annular ratio shown in FIG. 4B or FIG. 5B becomes changeable (see U.S. Pat. No. 6,903,801 for details).

A light beam exiting the diffractive optical element 40 passes through a Fourier-transformation lens 41 and forms the first light intensity distribution A. Alternatively, by giving the diffractive optical element 40 an appropriate design, the first light intensity distribution A can be formed directly into an annular shape or quadrupole shape without the use of the Fourier-transformation lens 41.

Figure 15:
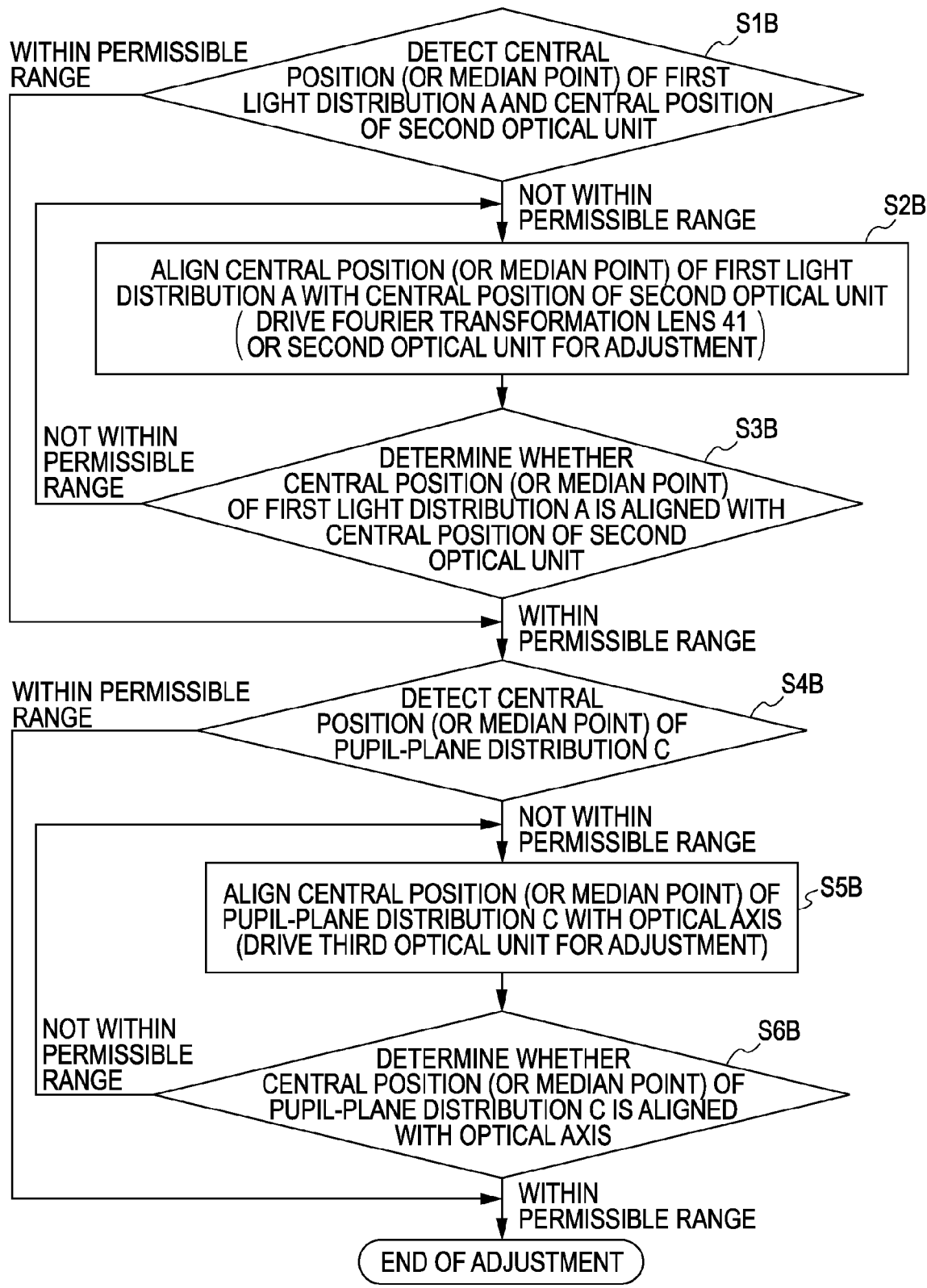
FIG. 15 is a flow chart of an adjustment technique.

FIG. 15 is a flow chart of an adjustment technique according to the third exemplary embodiment.

The adjustment technique includes step S1B to step S6B, which will be described below in detail.

In step S1B, the central position (or the center of gravity) of the first light intensity distribution A and the central position of the illumination-light formation part of the second optical unit 200 are detected. If a difference between the two positions is within a permissible range, the operation proceeds to step S4B. If the difference is not within the permissible range, the operation proceeds to step S2B.

Step S2B is a step for aligning the central position (or the center of gravity) of the first light intensity distribution A with the central position of the illumination-light formation part of the second optical unit 200. In order to achieve this, the first optical unit 100 (i.e. the Fourier-transformation lens 41 in this exemplary embodiment) can be driven for adjustment, or the illumination-light formation part of the second optical unit 200 can be driven for adjustment.

In step S3B, it is determined whether the central position (or the center of gravity) of the first light intensity distribution A and the central position of the illumination-light formation part of the second optical unit 200 are aligned with each other. If a difference between the two positions is within the permissible range, the operation proceeds to step S4B. If the difference is not within the permissible range, the operation returns to step S2B.

In step S4B, an amount of displacement of the central position (or the center of gravity) of the pupil-plane distribution C with respect to the optical axis is detected. If the amount of displacement is within a permissible range, the adjustment operation is completed. If the amount of displacement is not within the permissible range, the operation proceeds to step S5B.

Step S5B is a step for aligning the central position (or the center of gravity) of the pupil-plane distribution C with the optical axis. In order to achieve this, the third optical unit 300 is driven for adjustment.

In step S6B, it is determined whether the central position (or the center of gravity) of the pupil-plane distribution C is aligned with the optical axis. If an amount of displacement of the central position (or the center of gravity) of the pupil-plane distribution C with respect to the optical axis is within the permissible range, the adjustment operation is completed. If the amount of displacement is not within the permissible range, the operation returns to step S5B.

Fourth Exemplary Embodiment

A method for manufacturing a device using the above-described exposure apparatus according to a fourth exemplary embodiment of the present invention will now be described.

Figure 16:
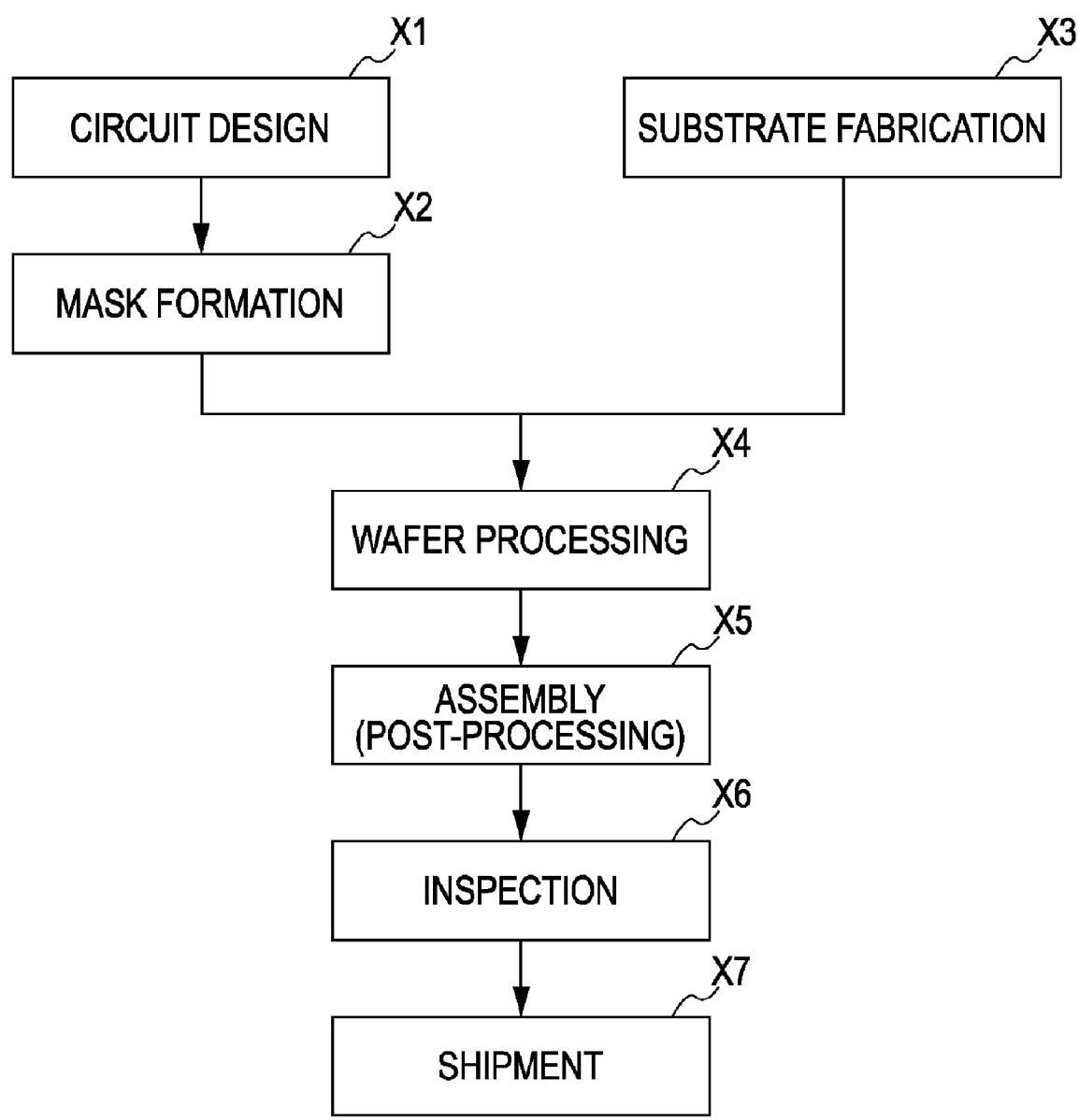
FIG. 16 is a flow chart of a method for manufacturing a device.

FIG. 16 is a flow chart showing the method for manufacturing a device, such as a semiconductor device and a liquid-crystal device, according to the fourth exemplary embodiment of the present invention. The method will be described below.

In step X1, a circuit pattern of, for example, a semiconductor device is designed.

In step X2, a mask having the designed circuit pattern is formed. On the other hand, in step X3, a substrate, such as a wafer, is fabricated using, for example, silicon.

Step X4 is called a preprocessing step (wafer processing step) in which the exposure apparatus according to one of the above exemplary embodiments can be used to form an actual circuit on the wafer by lithography using the mask (reticle) having the designed circuit pattern (first object) and the wafer (second object).

Step X5 is called a post processing step in which the wafer processed in step X4 is made into a semiconductor chip, and includes, for example, an assembly process (dicing, bonding) and a packaging process (chip insertion).

Step X6 is an inspection step including, for example, an operation test and a durability test for the semiconductor device formed in step X5. Thus of these steps, a semiconductor device is completed and is subject to shipment in step X7.

Figure 17:
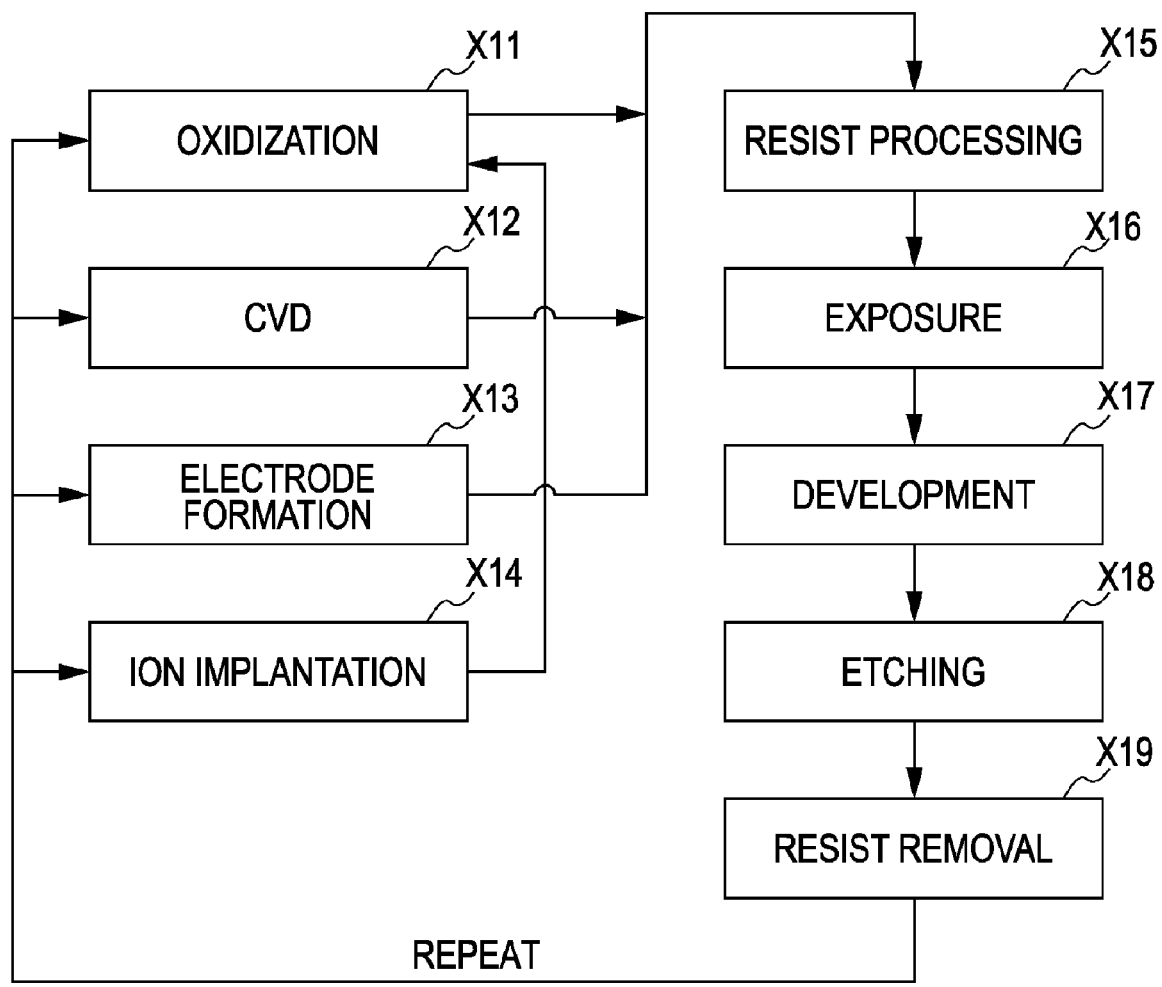
FIG. 17 is a flow chart of a wafer processing step included in the method in FIG. 16.

FIG. 17 is a flow chart of the wafer processing step described above (step X4). The wafer processing step can include sub-steps X11 to X19. Specifically, in sub-step X11, a surface of the wafer is oxidized. In sub-step X12, a chemical vapor deposition (CVD) is performed to form an insulating film on the wafer surface.

In sub-step X13, an electrode is formed on the wafer by vapor deposition. In sub-step X14, ion implantation is performed on the wafer. In sub-step X15, a photosensitive material can be applied to the wafer (resist processing). In sub-step X16, an exposure process is performed on the wafer using the exposure apparatus according to one of the above exemplary embodiments so as to print the circuit pattern of the reticle onto the wafer. In sub-step X17, the exposed wafer is developed. In sub-step X18, an etching process is performed to remove portions other than a developed resist portion. In sub-step X19, the resist portion that is no longer necessary after the etching process is removed.

By repeating these sub-steps, a multilayer circuit pattern is formed on the wafer.

Using the manufacturing method according to the fourth exemplary embodiment of the present invention, a semiconductor device, for example, can be manufactured with higher precision within a shorter period of time.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-218727 filed Jul. 28, 2005, which is hereby incorporated by reference herein in its entirety.

What is claimed is:

1. An exposure apparatus comprising:
    an illumination optical system configured to irradiate a mask with light from a light source; and
    a projecting optical system configured to project a pattern image of the mask onto a substrate,
    wherein the illumination optical system includes a first optical unit configured to provide a first light intensity distribution, a second optical unit configured to change a shape of the first light intensity distribution so as to provide a second light intensity distribution, and a third optical unit configured to change a dimension of the second light intensity distribution so as to provide a third light intensity distribution, the first optical unit, the second optical unit, and the third optical unit being arranged in that order from the light source, and
    wherein a symmetry of the third light intensity distribution and a center of gravity of the third light intensity distribution are individually adjustable by decentering in an optical path of the illumination optical system at least two of the first optical unit, the second optical unit, and the third optical unit.

2. The exposure apparatus according to claim 1, wherein a symmetry of the second light intensity distribution is adjustable by decentering at least one of the first optical unit and the second optical unit in the optical path, and the center of gravity of the third light intensity distribution is adjustable by decentering the third optical unit in the optical path.

3. The exposure apparatus according to claim 1, wherein the first optical unit includes an optical rod.

4. The exposure apparatus according to claim 1, wherein the first optical unit includes a plurality of replaceable diffractive optical elements.

5. The exposure apparatus according to claim 1, wherein the second optical unit includes a plurality of replaceable refractive optical elements.

6. The exposure apparatus according to claim 1, wherein the second optical unit includes an aperture stop configured to regulate an aperture.

7. The exposure apparatus according to claim 1, wherein the third light intensity distribution comprises a light intensity distribution of the light on a surface that has substantially a Fourier transformation relationship with the mask.

8. The exposure apparatus according to claim 1, further comprising:
    a detector configured to detect the third light intensity distribution; and
    a controller configured to determine decentering amounts of the at least two of the first optical unit, the second optical unit, and the third optical unit on the basis of the detection result of the detector.

9. A method for manufacturing a device, comprising the steps of:
    exposing a substrate to light using the exposure apparatus according to claim 1; and
    developing the exposed substrate.

* * * * *